(12) United States Patent
Kim et al.

(10) Patent No.: US 8,724,411 B2
(45) Date of Patent: May 13, 2014

(54) MEMORY DEVICES AND MEMORY SYSTEMS INCLUDING DISCHARGE LINES

(75) Inventors: Jin-Young Kim, Seoul (KR); Ki Whan Song, Yongin-si (KR); Jae Hee Oh, Seongnam-si (KR); Ji-Hyun Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 311 days.

(21) Appl. No.: 13/251,611

(22) Filed: Oct. 3, 2011

(65) Prior Publication Data

US 2012/0092946 A1    Apr. 19, 2012

(51) Int. Cl.
  *G11C 7/00* (2006.01)
(52) U.S. Cl.
  USPC .............. 365/203; 365/204; 365/115
(58) Field of Classification Search
  CPC ... G11C 11/413; G11C 11/4096; G11C 19/14
  USPC .......................... 365/203, 204, 115
  See application file for complete search history.

(56) References Cited

U.S. PATENT DOCUMENTS

| 4,021,781 | A | * | 5/1977 | Caudel ..................... 711/211 |
| 7,257,039 | B2 | | 8/2007 | Bedeschi et al. |
| 8,289,764 | B2 | * | 10/2012 | Hanzawa .................. 365/163 |
| 8,406,043 | B2 | * | 3/2013 | Yoon ....................... 365/163 |
| 8,445,880 | B2 | * | 5/2013 | Park ......................... 257/2 |
| 2009/0086534 | A1 | | 4/2009 | DeBrosse et al. |

FOREIGN PATENT DOCUMENTS

| KR | 1020090010603 A | 1/2009 |
| KR | 1020090037697 A | 4/2009 |

* cited by examiner

*Primary Examiner* — Son Dinh
*Assistant Examiner* — Nam Nguyen
(74) *Attorney, Agent, or Firm* — Myers Bigel Sibley & Sajovec, P.A.

(57) ABSTRACT

A non-volatile memory device can include a word line that is operatively coupled to a non-volatile memory cell. A local bit line can be operatively coupled to the non-volatile memory cell. A discharge line that is associated with the local bit line can be configured to discharge the local bit line and a discharge diode can be electrically coupled between the local bit line and the discharge line.

14 Claims, 15 Drawing Sheets

MEMORY DEVICES AND MEMORY SYSTEMS INCLUDING DISCHARGE LINES

CROSS-REFERENCE TO RELATED APPLICATIONS

This application claims priority under 35 U.S.C. §119(a) from Korean Patent Application No. 10-2010-0101982 filed on Oct. 19, 2010, the disclosure of which is hereby incorporated by reference in its entirety.

BACKGROUND

Embodiments of the present inventive concept relates to the field of electronics, and more particularly, to memory devices.

Non-volatile memory, such as, phase change random access memory (PRAM), resistive RAM (RRAM), and magnetic RAM (MRAM) can utilize resistive materials for operations. A memory cell array of a nonvolatile memory device may includes both a read global bit line for reading data from a first memory cell, and a write global bit line for writing data to a second memory cell.

SUMMARY

Embodiments according to the inventive concept can provide memory devices and memory systems including discharge lines and methods of forming. Pursuant to these embodiments, a memory device can include a plurality of sub cell arrays, where each includes a plurality of memory cells that are respectively disposed at intersections of a plurality of local bit lines and a plurality of word lines and a discharge line. A plurality of diodes can be connected to the local bit lines, respectively, and to the discharge line.

In some embodiments according to the inventive concept, anodes of the respective diodes can be connected to the local bit lines, respectively, and cathodes of the respective diodes can be connected to the discharge line. In some embodiments according to the inventive concept, each of the diodes can include a cell diode or a planar diode. In some embodiments according to the inventive concept, the device can further include a switch that can be connected between the discharge line and a ground and can be configured to selectively electrically couple the discharge line to the ground in response to a discharge enable signal.

In some embodiments according to the inventive concept, the device can further include a plurality of local bit line selection circuits where each can be configured to connect one of the local bit lines to a global bit line in response to a plurality of column selection signals.

According to other embodiments of the present inventive concept, there is provided a memory system including the above-described memory device and a processor configured to control an operation of the memory device. The memory system may be a personal computer (PC), a tablet PC, a solid state drive (SSD), or a cellular phone.

According to other embodiments of the present inventive concept, a non-volatile memory device can include a word line that is operatively coupled to a non-volatile memory cell. A local bit line can be operatively coupled to the non-volatile memory cell. A discharge line that is associated with the local bit line can be configured to discharge the local bit line and a discharge diode can be electrically coupled between the local bit line and the discharge line.

In some embodiments according to the inventive concept, a method of manufacturing a memory device can be provided by forming a plurality of cell diodes on an active region. A first electrode can be formed on each of the cell diodes and a phase-change material can be formed on a first group of cell diodes that excludes a remaining group of cell diodes, to leave the remaining group exposed. A local bit line can be on the first group and on the remaining group.

DETAILED DESCRIPTION OF THE EMBODIMENTS ACCORDING TO THE INVENTIVE CONCEPT

Figure 1:
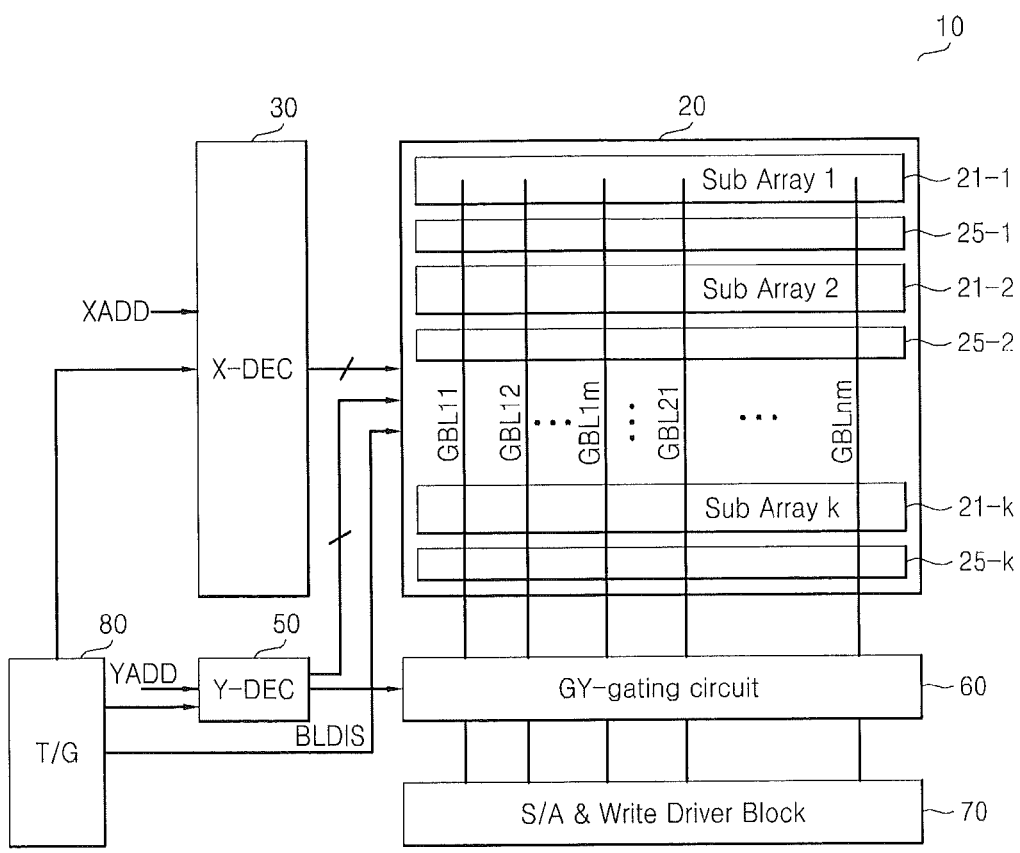
FIG. 1 is a block diagram of a memory device according to some embodiments of the present inventive concept.

The present inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As described herein, in some embodiments according to the inventive concept, a memory device can allow a discharge time to be reduced by discharging a bit line voltage using a diode, which may avoid deterioration of performance caused associated with, for example, a phase-change material.

Figure 2:
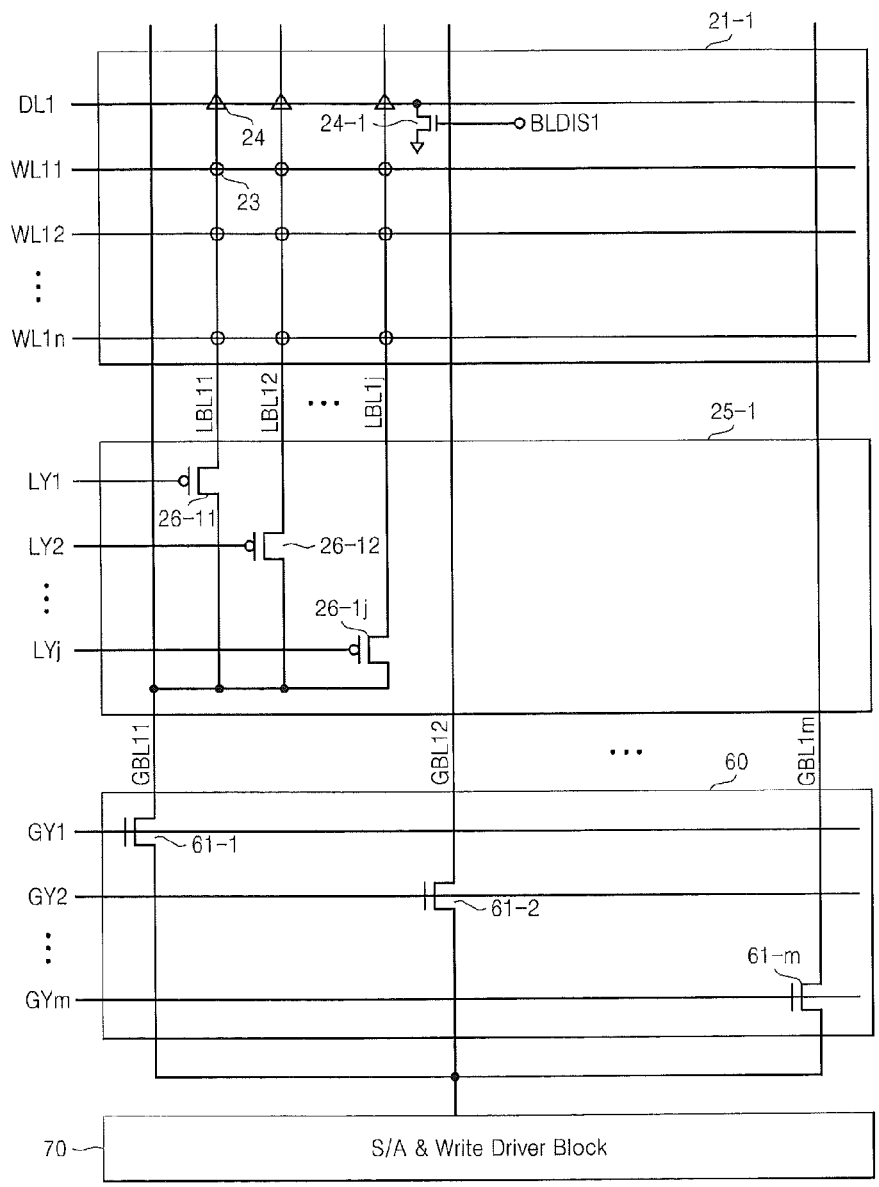
FIG. 2 is a circuit diagram for explaining the operation of the memory device illustrated in FIG. 1.

FIG. 1 is a block diagram of a memory device 10 according to some embodiments of the present inventive concept. FIG. 2 is a circuit diagram for explaining the operation of the memory device 10 illustrated in FIG. 1. The memory device 10 illustrated in FIGS. 1 and 2 is a semiconductor device that can perform a method of discharging a local bit line voltage according to some embodiments of the present inventive concept and may be a volatile or non-volatile memory device.

The memory device 10 can be a volatile memory device such as a dynamic random access memory (DRAM), a static RAM (SRAM), a thyristor RAM (T-RAM), a zero-capacitor RAM (Z-RAM), a twin transistor RAM (TTRAM), or the like. The memory 10 can be a non-volatile memory device such as an electrically erasable programmable read-only memory (EEPROM), a flash memory, a ferroelectric RAM (FeRAM or FRAM), a magnetoresistive RAM (MRAM), a phase-change RAM (PRAM), a resistive RAM (RRAM), a nano RAM (NRAM) or the like. Herein the memory device 10 is described as a PRAM device in reference to the Figures, but it will be understood that the present inventive concept can be applied to any type of volatile memory device or non-volatile memory device.

Referring to FIGS. 1 and 2, the nonvolatile memory device 10 includes a memory cell array 20, a row decoder 30, a column decoder 50, a Y-gating circuit 60, a sense amplifier (S/A) and write driver block 70, and a timing generator 80.

The memory cell array 20 includes a plurality of global bit lines GBL11 through GBLnm, a plurality of sub cell arrays 21-1 through 21-k, and a plurality of local bit line selection circuits 25-1 through 25-k. Here, "n", "m", and "k" are natural numbers. Since the plurality of sub cell arrays 21-1 through 21-k may have substantially the same structure, the structure and the operations of only the first sub cell array 21-1 will be described.

The first sub cell array 21-1 includes a plurality of non-volatile memory cells 23 and a plurality of discharge cells 24. Each of the plurality of non-volatile memory cells 23 is connected with one of a plurality of local bit lines LBL11 through LBL1$j$ (where "j" is a natural number) and one of a plurality of word lines WL11 through WL1$n$. The discharge cells 24 are connected with the local bit lines LBL11 through LBL1$j$, respectively, and a discharge line DL1.

The first sub cell array 21-1 may further include a first switch 24-1 which connects the discharge line DL1 to a ground in response to a discharge enable signal BLDIS1. The first switch 24-1 may be implemented by an N-type metal-oxide-semiconductor (NMOS) transistor. At this time, when the discharge enable signal BLDIS1 at a high level is applied to a gate of the NMOS transistor, the voltage of the discharge line DL1 is discharged to the ground.

Meanwhile, since the local bit line selection circuits 25-1 through 25-$k$ may have substantially the same structure, the structure and the operation of only the first local bit line selection circuit 25-1 will be described. The first local bit line selection circuit 25-1 includes a plurality of second switches 26-11 through 26-1$j$, which connect the local bit lines LBL11 through LBL1$j$, respectively to the first global bit line GBL11 in response to a plurality of local bit line selection signals LY1 through LY$j$, respectively, output from the column decoder 50. According to some embodiments, each of the second switches 26-11 through 26-1$j$ may be implemented by a P-type metal-oxide-semiconductor (PMOS) transistor.

Each of the plurality of non-volatile memory cells 23 can store data using a phase-change material, e.g., GeSbTe (GST), and include a memory element and a select element. The phase-change material is switched between two stable states, i.e., a crystalline state and an amorphous state according to temperature.

Figure 3:
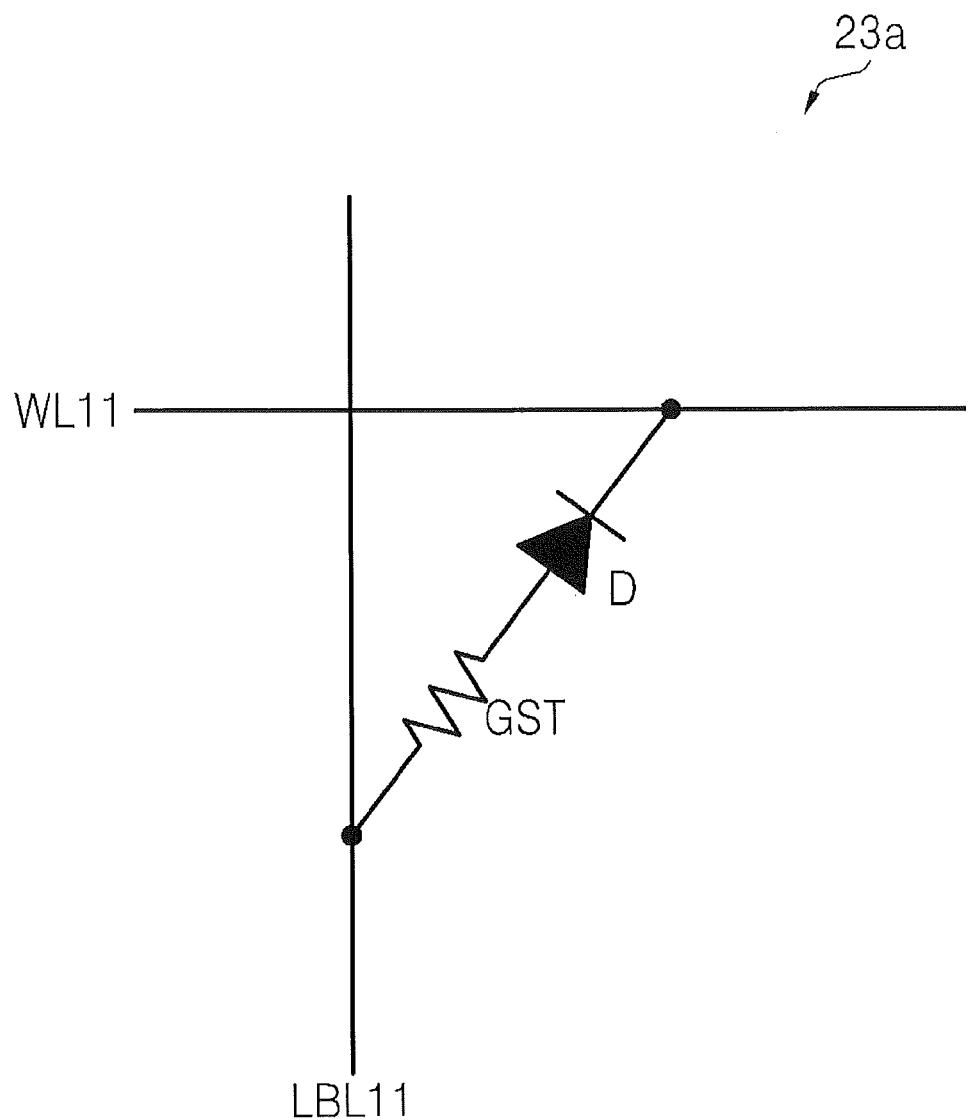
FIG. 3 shows an example of a memory cell illustrated in FIG. 2.

FIG. 3 shows an example of a memory cell 23$a$ illustrated in FIG. 2. The memory cell 23$a$ illustrated in FIG. 3 is a non-volatile memory cell and includes a memory element GST and a select element D which are connected in series between the local bit line LBL11 and the word line WL11. The phase change material is used as the memory element GST and the diode is used as the select element D.

In other words, the anode of the diode D is connected to the memory element GST and the cathode of the diode D is connected to the word line WL11. When a voltage difference between the anode and the cathode of the diode D is greater than a threshold voltage of the diode D, the memory element GST of the non-volatile memory cell 23$a$ may be provided with a program current, e.g., a set current or a reset current, through the local bit line LBL11.

Figure 4:
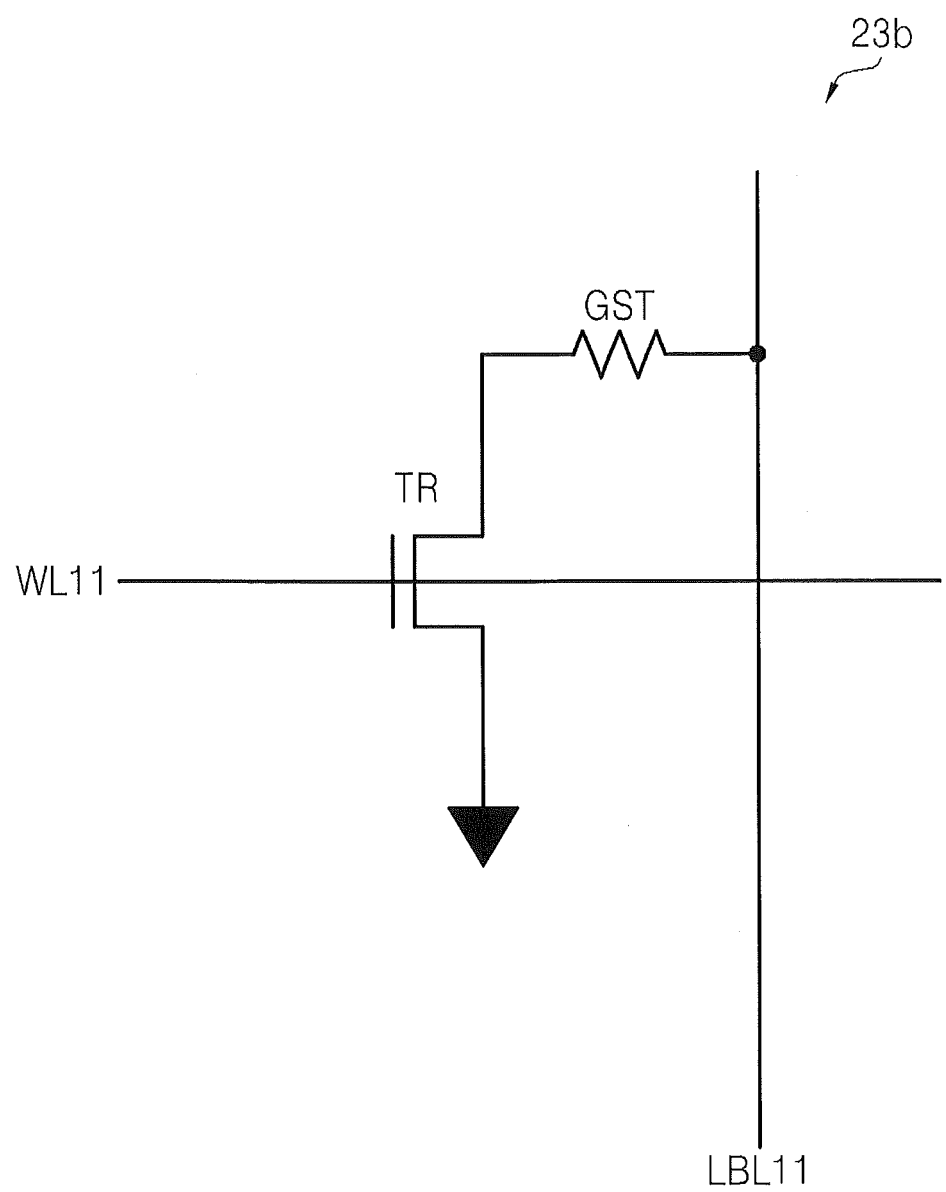
FIG. 4 shows another example of the memory cell illustrated in FIG. 2.

FIG. 4 shows another example of the memory cell 23$b$ illustrated in FIG. 2. The memory cell 23$b$ illustrated in FIG. 4 is a non-volatile memory cell and includes a memory element GST and a select element TR which are connected in series between the local bit line LBL11 and a power line (e.g., a ground line for supplying a ground voltage or a power line for supplying a predetermined voltage).

The phase change material is used as the memory element GST and the transistor is used as the select element TR. When a voltage supplied to the word line WL11 is greater than a threshold voltage of the transistor TR, the memory element GST of the non-volatile memory cell 23$b$ may be provided with a program current, e.g., a set current or a reset current, through the local bit line LBL11.

Figure 5:
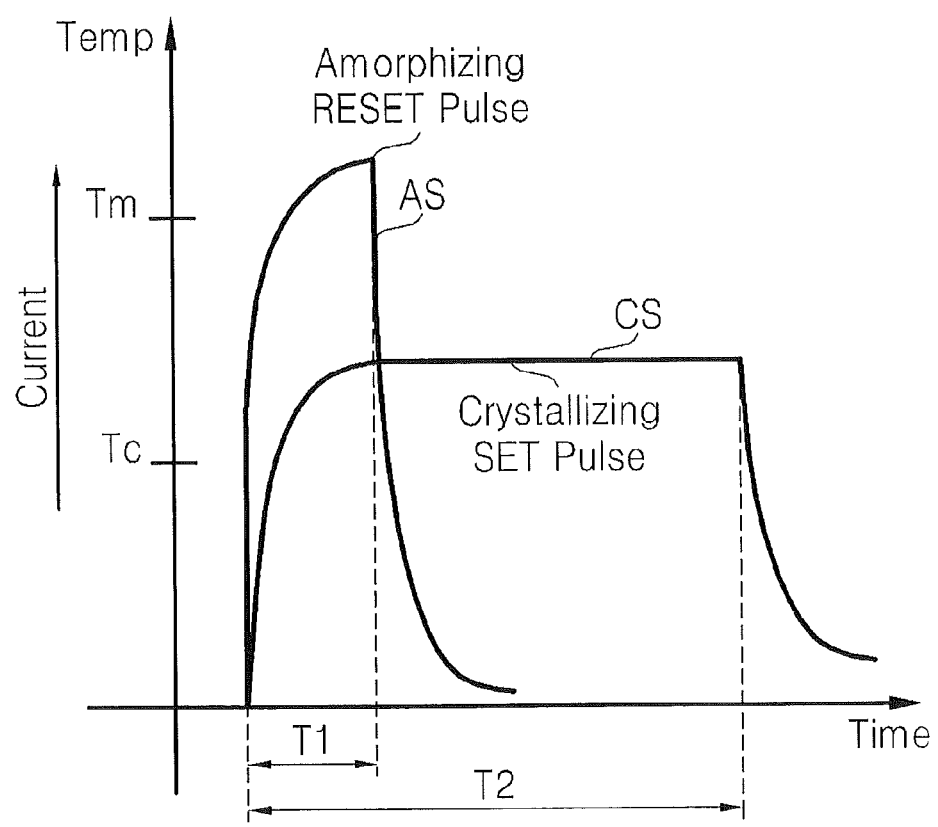
FIG. 5 is a graph showing the characteristics of a phase change material illustrated in FIGS. 3 and 4.

FIG. 5 is a graph showing the characteristics of the phase-change material, i.e., GST illustrated in FIGS. 3 and 4. The curve AS indicates a condition, e.g., a current, allowing the phase-change material, GST, to transform into the amorphous state and the curve CS indicates a condition, e.g., a current, allowing the phase-change material, GST, to transform into the crystalline state.

Referring to FIGS. 3 through 5, the phase-change material, GST, transforms into the amorphous state when it is heated by the current AS supplied through the local bit line LBL11 during a first time T1 to a temperature higher than a melting temperature Tm and then rapidly quenched. The phase-change material, GST, transforms into the crystalline state when it is heated by the current CS supplied through the local bit line LBL11 during a second time T2 longer than the first time T1 (i.e., T2>T1) to a temperature higher than a crystallization temperature Tc and lower than the melting temperature Tm and then gradually quenched.

The non-volatile memory cells 23, 23a, and 23b have a greater resistance when the phase-change material, GST, is in the amorphous state than when the phase-change material, GST, is in the crystalline state. Accordingly, the phase-change material, GST, can store data using this resistance difference. The amorphous state may be called a reset state and may indicate storing data "1". The crystalline state may be called a set state and may indicate storing data "0".

Referring back to FIGS. 1 and 2, the row decoder 30 decodes a row address XADD and selectively drives one of the word lines WL11 through WL1n included in the memory cell array 20 according to a result of the decoding. The column decoder 50 decodes a column address YADD and outputs a plurality of global bit line selection signals GY1 though GYm and the local bit line selection signals LY1 through LYj according to a result of the decoding.

The Y-gating circuit 60 controls the connection of the memory cell array 20 and the S/A and write drive block 70 in response to the global bit line selection signals GY1 through GYm output from the column decoder 50. For instance, a plurality of switches 61-1 through 61-m included in the Y-gating circuit 60 control the connection between the respective global bit lines GBL11 through GBL1m and the S/A and write drive block 70 in response to the global bit line selection signals GY1 through GYm, respectively.

The S/A and write drive block 70 transmits write data to the Y-gating circuit 60 in a write operation and senses and amplifies read data output from the Y-gating circuit 60 in a read operation.

The timing generator 80 may control the overall operation of the memory device 10, e.g., a program or write operation using a discharge operation according to some embodiments of the present inventive concept. The timing generator 80 also generates the discharge enable signal BLDIS1 for controlling the operation of the first switch 24-1. In addition, the timing generator 80 may generate the row address XADD and the column address YADD in response to an external command, e.g., a program command or a read command.

Figure 6:
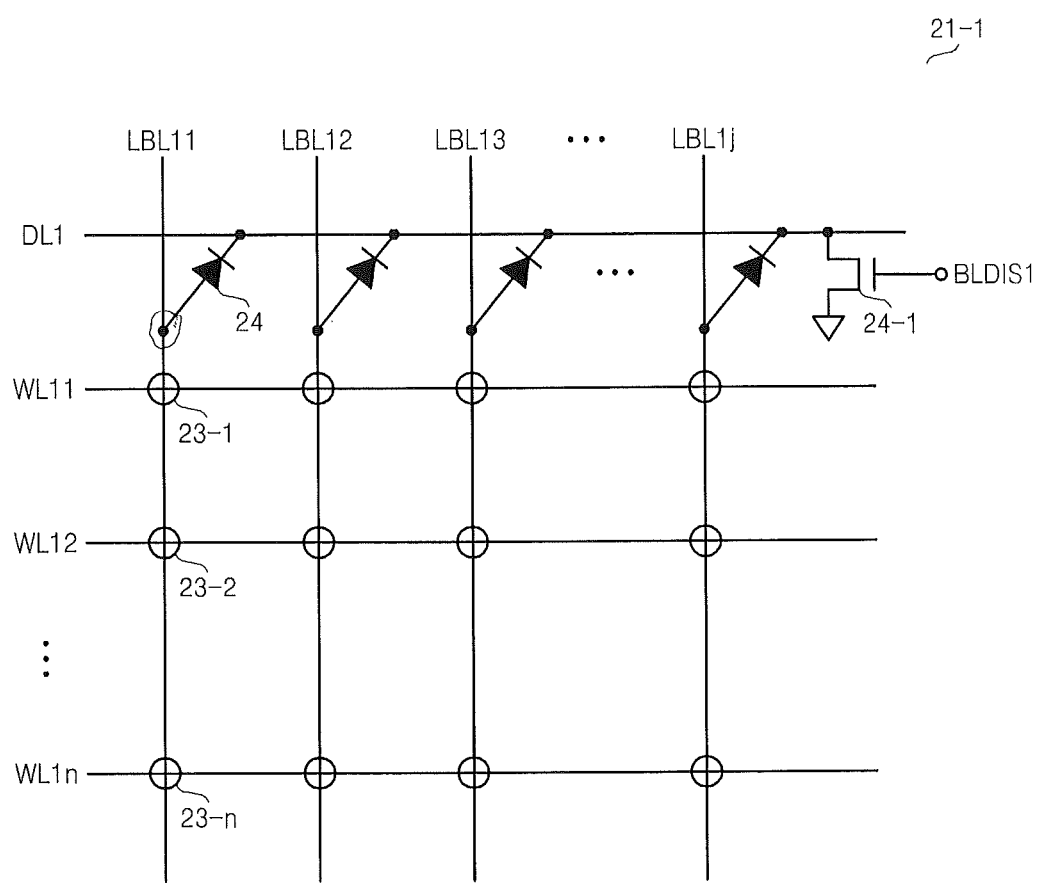
FIG. 6 is an internal circuit diagram of a sub cell array illustrated in FIG. 2.

FIG. 6 is an internal circuit diagram of the sub cell array 21-1 illustrated in FIG. 2. Referring to FIGS. 2 and 6, the sub cell array 21-1 includes a plurality of non-volatile memory cells 23-1 through 23-n and a plurality of discharge cells 24.

Each of the non-volatile memory cells 23-1 through 23-n is connected with one of the local bit lines LBL11 through LBL1j and one of the word lines WL11 through WL1n, respectively. The discharge cells 24 are connected with the local bit lines LBL11 through LBL1j, respectively, and with the discharge line DL1.

Although the discharge line DL1 is disposed above the first word line WL11 in FIG. 6, the discharge line DL1 may be disposed below the n-th word line WL1n or between predetermined two word lines. Each of the discharge cells 24 may be implemented by a diode, which may be a cell diode or a planar diode. At this time, the anodes of the respective diodes 24 are respectively connected to the local bit lines LBL11 through LBL1j and the cathodes thereof are connected to the discharge line DL1.

According to some embodiments, the sub cell array 21-1 may include the first switch 24-1 which connects the discharge line DL1 to the ground in response to the discharge enable signal BLDIS1. Accordingly, when the first switch 24-1 is turned on in response to the discharge enable signal BLDIS1 at the high level, the voltage of each of the local bit lines LBL11 through LBL1j may be discharged to the ground.

Figure 7:
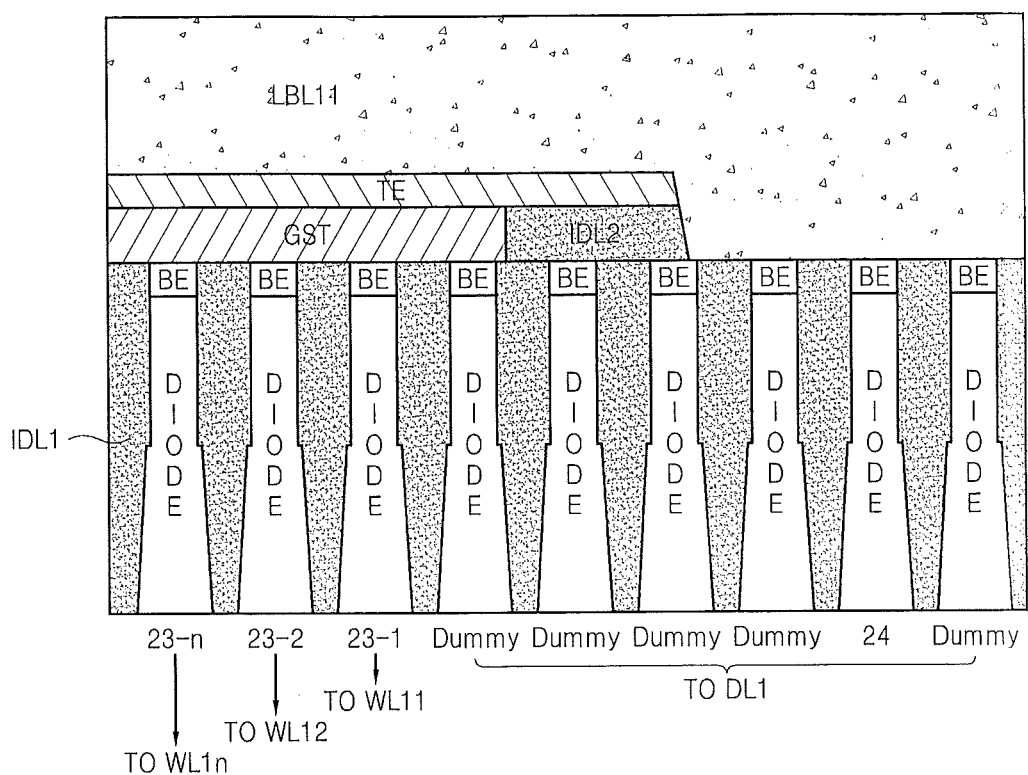
FIG. 7 is a cross-sectional view taken along a first local bit line illustrated in FIG. 6 according to some embodiments of the present inventive concept.

FIG. 7 is a cross-sectional view taken along the first local bit line LBL11 illustrated in FIG. 6. Referring to FIGS. 6 and 7, a first interlayer dielectric layer IDL1 is formed on or in a semiconductor substrate.

A photoresist layer is formed on the first interlayer dielectric layer IDL1 and then patterned to form a photoresist pattern. The first interlayer dielectric layer IDL1 is selectively etched using the photoresist pattern as a mask. A plurality of cell diodes 23-1 through 23-n, a plurality of dummy diodes, and a discharge diode 24 are formed piercing the first interlayer dielectric layer IDL1 through etched portions. A first electrode BE is formed on each of the cell diodes 23-1 through 23-n, the dummy diodes, and the discharge diode 24.

A second interlayer dielectric layer IDL2 is formed on the first interlayer dielectric layer IDL1. At this time, an etch stopper is formed between the first interlayer dielectric layer IDL1 and the second interlayer dielectric layer IDL2 and a phase-change material, i.e., GST is formed to contact the first electrodes BE of the cell diodes 23-1 through 23-n, passing through the second interlayer dielectric layer IDL2 and the etch stopper. The GST is also formed on the first electrode BE of the dummy diode adjacent to the first cell diode 23-1 in FIG. 7 to secure an align margin during processes, but the GST may not formed on the dummy diode. Further the GST is not formed on a remaining group of cell diodes that at least includes the discharge diode 24 so that the remaining group is exposed.

A second electrode TE is formed on the GST to be electrically connected to the GST. A third interlayer dielectric layer is formed on the second interlayer dielectric layer IDL2. A photoresist layer is formed on the third interlayer dielectric layer and then patterned to form a photoresist pattern. The third interlayer dielectric layer is selectively etched using the photoresist pattern as a mask.

Figure 8:
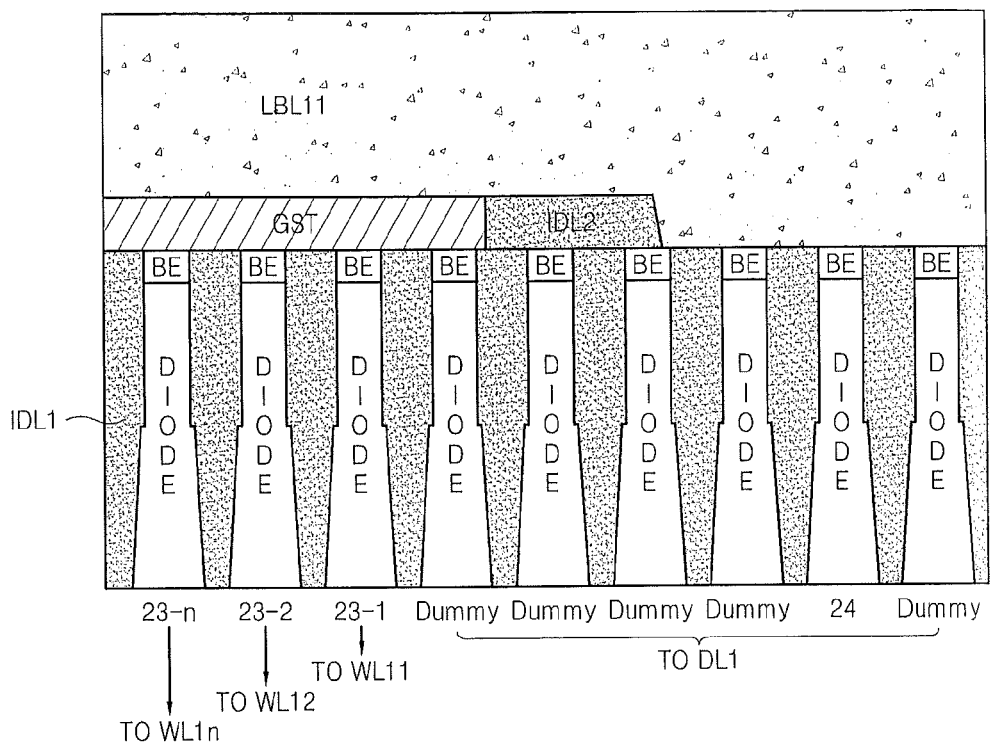
FIG. 8 is a cross-sectional view taken along the first local bit line illustrated in FIG. 6 according to other embodiments of the present inventive concept.

The first local bit line LBL11 is formed through the etched third interlayer dielectric layer to be electrically connected to the second electrode TE and the first electrode BE on the discharge diode 24. As illustrated in FIGS. 7 and 8, the GST is not formed on the discharge diode 24.

The word lines WL11 through WL1n are formed below the cell diodes 23-1 through 23-n, respectively, and the discharge line DL1 is formed below the discharge diode 24. For clarity of the description, the etch stopper among the first and second interlayer dielectric layers IDL1 and IDL2 and the third interlayer dielectric layer is not shown in FIG. 7.

FIG. 8 is a cross-sectional view taken along the first local bit line LBL11 illustrated in FIG. 6. Referring to FIGS. 6 and 8, a first interlayer dielectric layer IDL1 is formed on a semiconductor substrate.

A photoresist layer is formed on the first interlayer dielectric layer IDL1 and then patterned to form a photoresist pattern. The first interlayer dielectric layer IDL1 is selectively etched using the photoresist pattern as a mask. A plurality of cell diodes 23-1 through 23-*n*, a plurality of dummy diodes, and a discharge diode 24 are formed piercing the first interlayer dielectric layer IDL1 through etched portions. A first electrode BE is fainted on each of the cell diodes 23-1 through 23-*n*, the dummy diodes, and the discharge diode 24.

A second interlayer dielectric layer IDL2 is formed on the first interlayer dielectric layer IDL1. At this time, an etch stopper is formed between the first interlayer dielectric layer IDL1 and the second interlayer dielectric layer IDL2 and a phase-change material, i.e., GST is formed to contact the first electrodes BE of the cell diodes 23-1 through 23-*n*, piercing through the second interlayer dielectric layer IDL2 and the etch stopper. The etch stopper formed on the discharge diode 24 is removed using a photomask.

A third interlayer dielectric layer is formed on the second interlayer dielectric layer IDL2. A photoresist layer is formed on the third interlayer dielectric layer and then patterned to form a photoresist pattern. The third interlayer dielectric layer is selectively etched using the photoresist pattern as a mask.

The first local bit line LBL11 is formed through the etched third interlayer dielectric layer to be electrically connected to the GST and the first electrode BE on the discharge diode 24. As illustrated in FIGS. 6 and 8, the GST is not formed on the discharge diode 24. The word lines WL11 through WL1*n* are formed below the cell diodes 23-1 through 23-*n*, respectively, and the discharge line DL1 is formed below the discharge diode 24.

Figure 9:
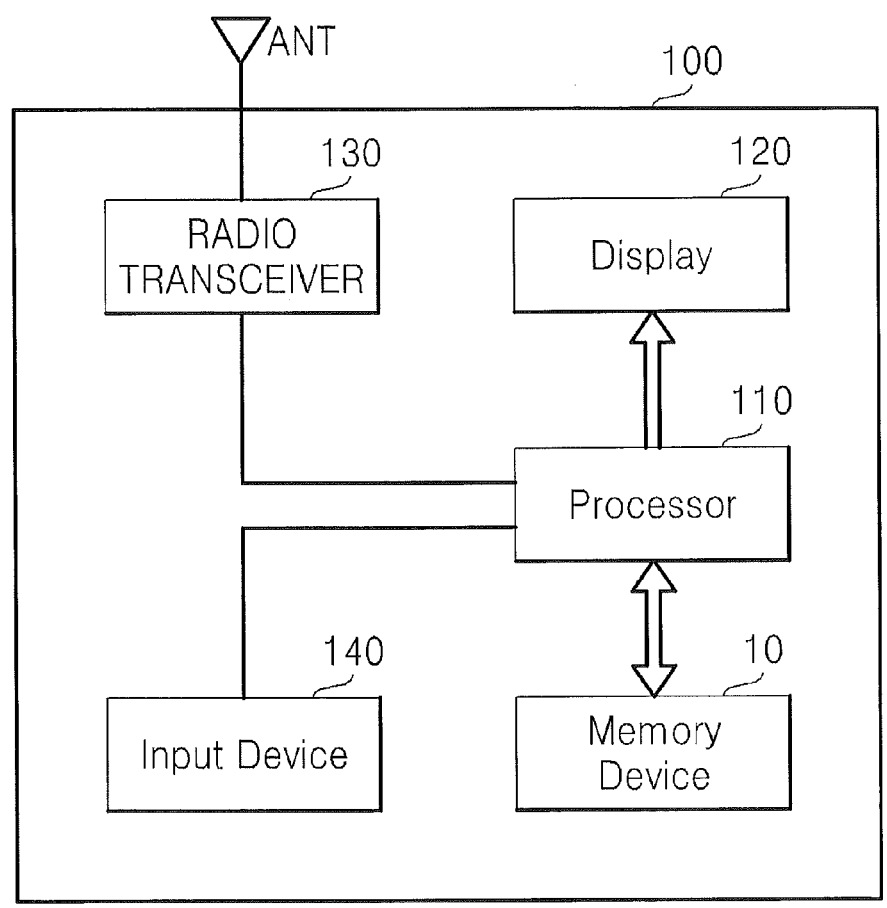
FIG. 9 is a block diagram of a memory system including the memory device illustrated in FIG. 1 according to some embodiments of the present inventive concept.

FIG. 9 is a block diagram of a memory system 100 including the memory device 10 illustrated in FIG. 1 according to some embodiments of the present inventive concept. The memory system 100 may be a cellular phone, a smart phone, or a wireless Internet system and include the memory device 10 and a processor 110 controlling the data processing operation, e.g., a program operation or a read operation.

Data stored in the memory device 10 may be controlled by the processor 110 to be displayed through a display 120. A radio transceiver 130 transmits or receives a radio signal through an antenna ANT. The radio transceiver 130 may convert the radio signal received through the antenna ANT into a signal that can be processed by the processor 110. Accordingly, the processor 110 may process the signal output from the radio transceiver 130 and store the processed signal in the memory device 10 or display it through the display 120. The radio transceiver 130 may also convert a signal output from the processor 110 into a radio signal and outputs the radio signal through the antenna ANT.

An input device 140 enables a control signal for controlling the operation of the processor 110 or data to be processed by the processor 110 to be input to the memory system 100. The input device 140 may be implemented by a pointing device such as a touch pad or a computer mouse, a keypad, or a keyboard.

The processor 110 may control the operation of the display 120 to display data output from the memory device 10, data output from the radio transceiver 130, or data output from the input device 140.

A memory controller which controls the operation of the memory device 10 may be included in or separate from the processor 110. At this time, the memory controller may control the operation of the memory device 10 in compliance with the processor 110.

Figure 10:
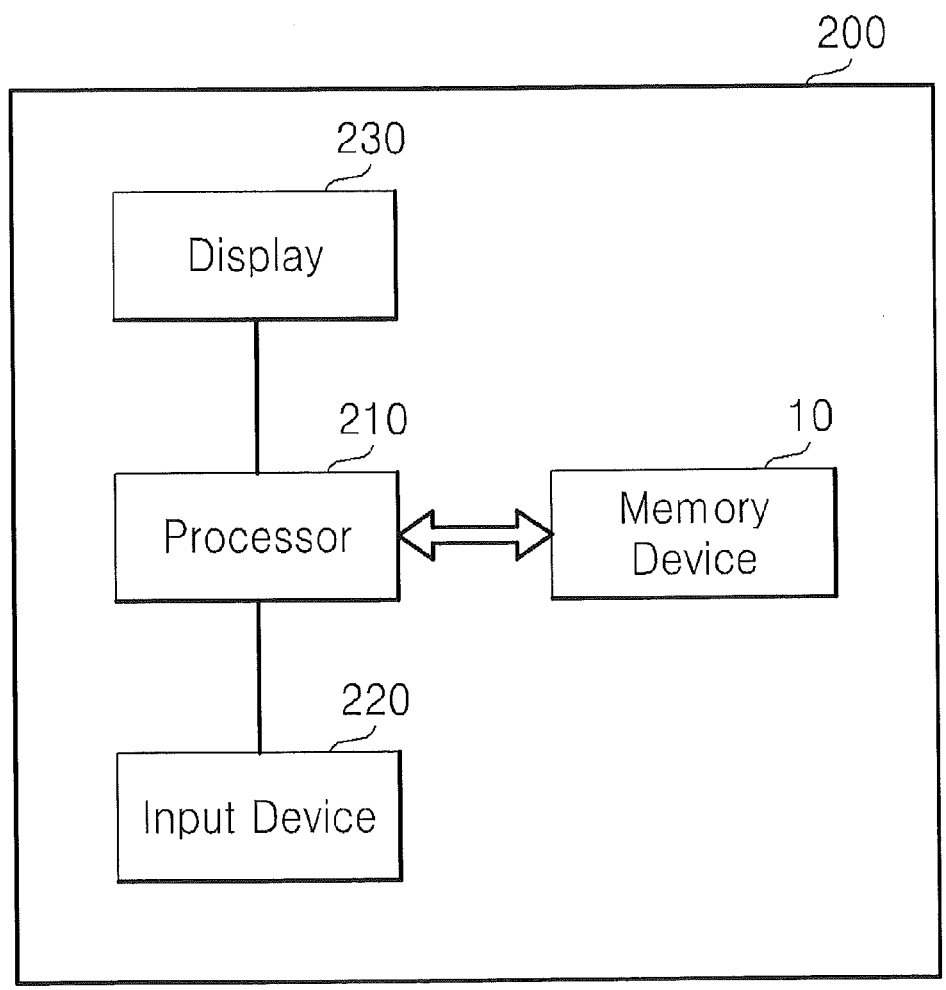
FIG. 10 is a block diagram of a memory system including the memory device illustrated in FIG. 1 according to other embodiments of the present inventive concept.

FIG. 10 is a diagram of a memory system 200 including the memory device 10 illustrated in FIG. 1, according to other embodiments of the present inventive concept. The memory system 200 may be a data processor such as a personal computer (PC), a tablet PC, a netbook, an e-reader, a personal digital assistant (PDA), a portable multimedia player (PMP), an MP3 player, or an MP4 player. The memory system 200 includes the memory device 10 and a processor 210 controlling the data processing operation of the memory device 10.

The processor 210 may display data stored in the memory device 10 through a display 230 in response to an input signal generated by an input device 220. The input device 220 may be implemented by a pointing device such as a touch pad or a computer mouse, a keypad, or a keyboard.

A memory controller which controls the operation of the memory device 10 may be included in or separated from the processor 210. At this time, the memory controller may control the operation of the memory device 10 in compliance with the processor 210.

Figure 11:
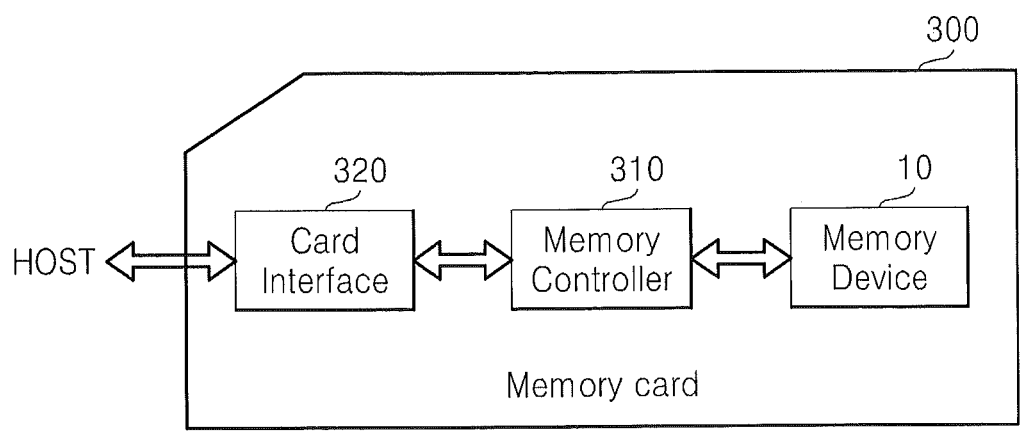
FIG. 11 is a block diagram of a memory system including the memory device illustrated in FIG. 1 according to further embodiments of the present inventive concept.

FIG. 11 is a diagram of a memory system 300 including the memory device 10 illustrated in FIG. 1, according to further embodiments of the present inventive concept. The memory system 300 may be a memory card or a smart card. The memory system 300 includes the memory device 10, a memory controller 310, and a card interface 320.

The memory controller 310 may control data exchange between the memory device 10 and the card interface 320. The card interface 320 may be a secure digital (SD) card interface or a multi-media card (MMC) interface, but the present inventive concept is not restricted to the current embodiments. The card interface 320 may interface a host and the memory controller 310 for data exchange according to a protocol of the host. When the memory system 300 is connected with a host such as a computer, a digital camera, a digital audio player, a cellular phone, a console video game hardware, or a digital set-top box, the host may transmit data to or receive data from the memory device 10 through the card interface 320 and the memory controller 310.

Figure 12:
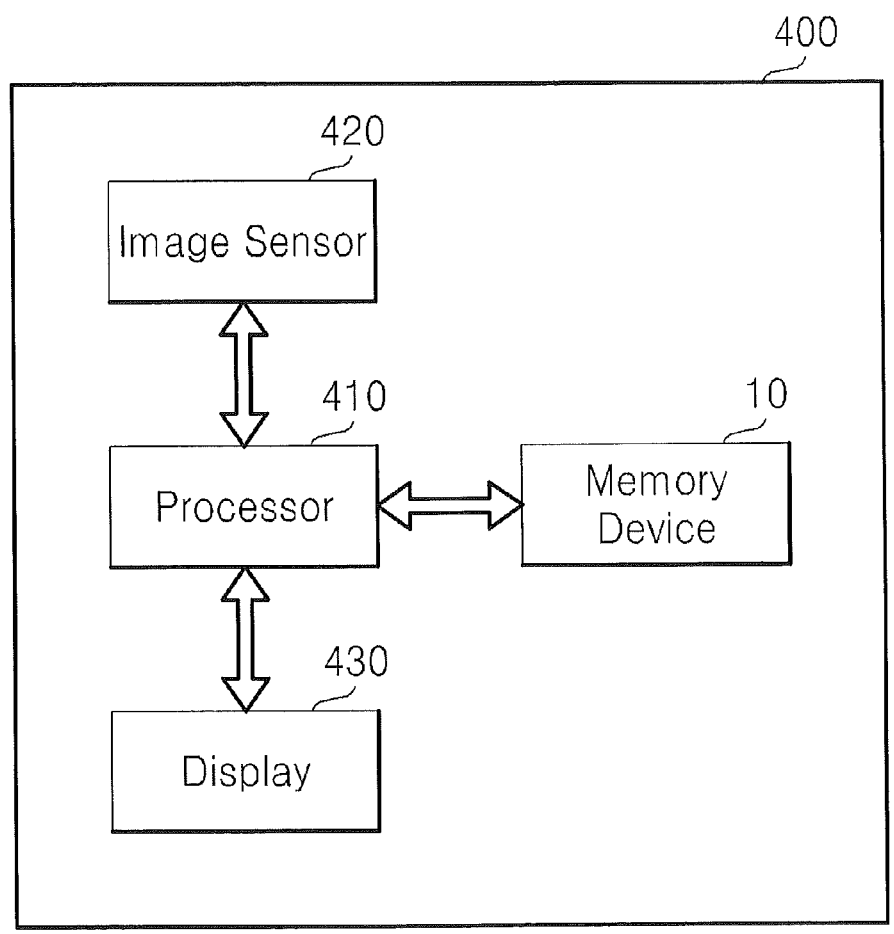
FIG. 12 is a block diagram of a memory system including the memory device illustrated in FIG. 1 according to other embodiments of the present inventive concept.

FIG. 12 is a diagram of a memory system 400 including the memory device 10 illustrated in FIG. 1, according to other embodiments of the present inventive concept. The memory system 400 may be a digital camera or a cellular phone equipped with a digital camera. The memory system 400 includes the memory device 10 and a processor 410 controlling the data processing operation of the memory device 10.

An image sensor 420 included in the memory system 400 converts optical images into digital signals. The digital signals are controlled by the processor 410 to be stored in the memory device 10 or displayed through a display 430. The digital signals stored in the memory device 10 may also be controlled by the processor 410 to be displayed through the display 430.

A memory controller (not shown) which controls the operation of the memory device 10 may be included in or separated from the processor 410. At this time, the memory controller may control the operation of the memory device 10 in compliance with the processor 410.

Figure 13:
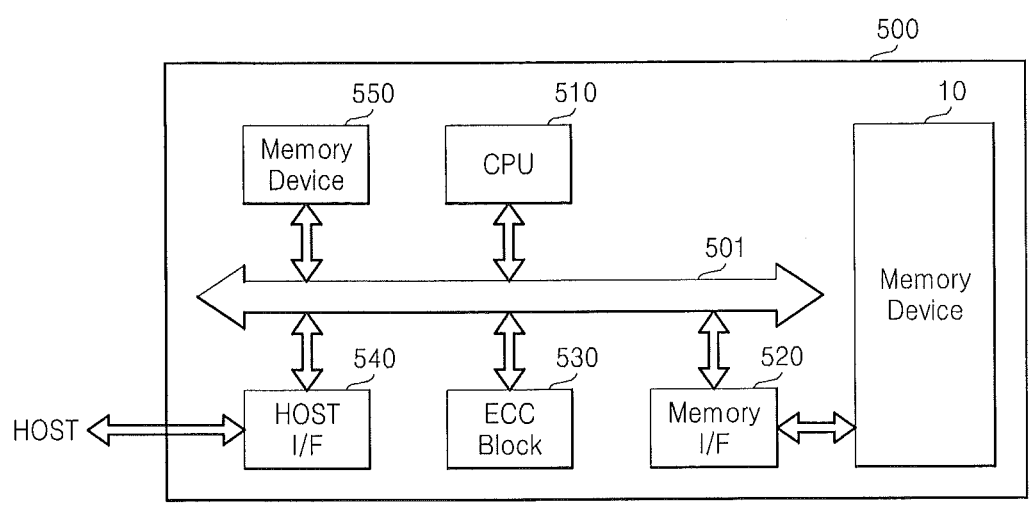
FIG. 13 is a block diagram of a memory system including the memory device illustrated in FIG. 1 according to yet other embodiments of the present inventive concept.

FIG. 13 is a diagram of a memory system 500 including the memory device 10 illustrated in FIG. 1, according to yet other embodiments of the present inventive concept. The memory system 500 includes the memory device 10 and a central processing unit (CPU) 510 controlling the operation of the memory device 10. The memory system 500 also includes another memory device 550, which can be an operational memory of the CPU 510. The memory device 550 may be implemented by a non-volatile memory like read-only memory (ROM). A host connected with the memory system 500 may transmit data or receive data from the memory device 10 through a memory interface 520 and a host interface 540.

An error correction code (ECC) block 530 is controlled by the CPU 510 to detect and correct errors in data read from the memory device 10 through the memory interface 520. The CPU 510 controls data exchange among the memory interface 520, the ECC block 530, the host interface 540, and the memory device 550 through a bus 501. The memory system 500 may be a universal serial bus (USB) memory drive or memory stick.

Figure 14:
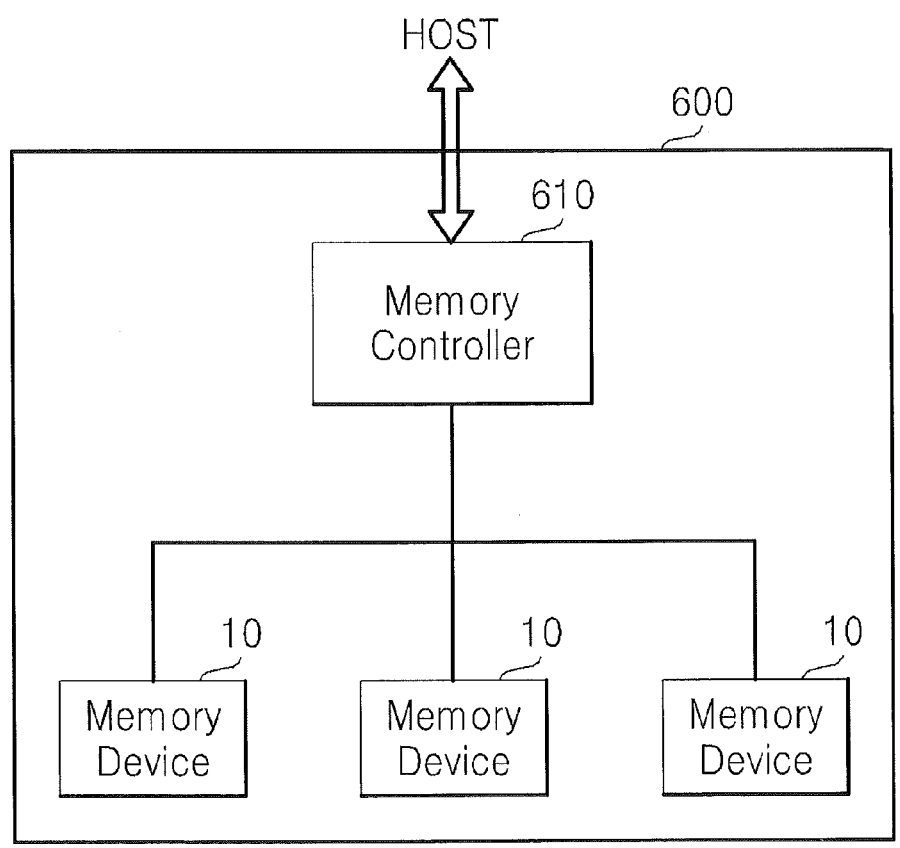
FIG. 14 is a block diagram of a memory system including the memory device illustrated in FIG. 1 according to still other embodiments of the present inventive concept.

FIG. 14 is a diagram of a memory system 600 including the memory device 10 illustrated in FIG. 1, according to still other embodiments of the present inventive concept. The memory system 600 may be a data storage system like a solid state drive (SSD). The memory system 600 includes a plurality of memory devices 10 and a memory controller 610 controlling the data processing operation of the memory devices 10. The memory system 600 may be implemented as a memory module.

Figure 15:
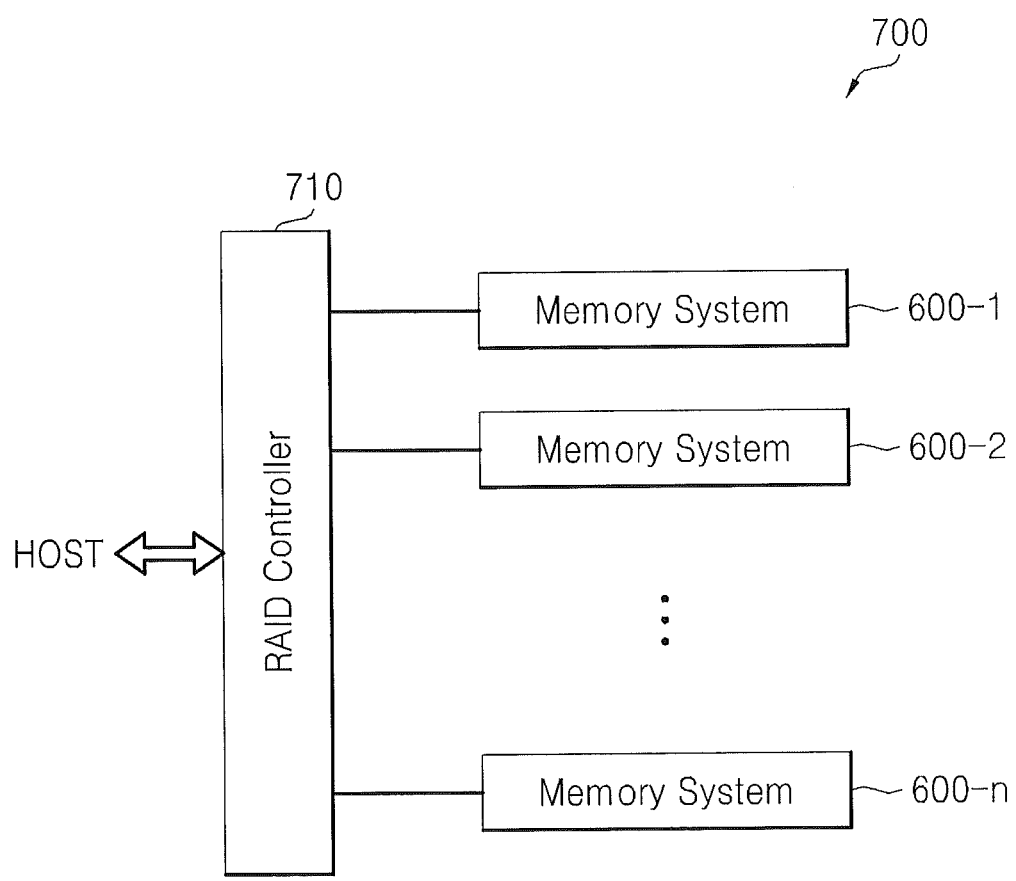
FIG. 15 is a block diagram of a data processing unit including the memory system illustrated in FIG. 14.

FIG. 15 is a diagram of a data processing unit 700 including the memory system 600 illustrated in FIG. 14. The data processing unit 700 may be implemented by a redundant array of independent disks (RAID). The data processing unit 700 includes a RAID controller 710 and a plurality of modules 600-1 through 600-n where "n" is a natural number.

Each of the modules 600-1 through 600-n may be the memory system 600 illustrated in FIG. 14. The modules 600-1 through 600-n may form a RAID array. The data processing unit 700 may be implemented as a personal computer or an SSD.

During a program operation, the RAID controller 710 may transmit program data received from a host to one of the modules 600-1 through 600-n according to a RAID level in response to a program command received from the host. During a read operation, the RAID controller 710 may transmit to the host data read from one of the modules 600-1 through 600-n in response to a read command received from the host.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A memory device comprising:
a plurality of sub cell arrays, each comprising;
a plurality of memory cells respectively disposed at intersections of a plurality of local bit lines and a plurality of word lines;
a discharge line;
a plurality of diodes connected to the local bit lines, respectively, and to the discharge line; and
a switch connected between the discharge line and a ground and configured to selectively electrically couple the discharge line to the ground in response to a discharge enable signal.

2. The memory device of claim 1, wherein anodes of the respective diodes are connected to the local bit lines, respectively, and cathodes of the respective diodes are connected to the discharge line.

3. The memory device of claim 1, wherein each of the diodes comprises a cell diode or a planar diode.

4. The memory device of claim 1, further comprising a plurality of local bit line selection circuits each configured to connect one of the local bit lines to a global bit line in response to a plurality of column selection signals.

5. The memory device of claim 4, wherein each of the local bit line selection circuits comprises a plurality of switches configured to respectively connect the local bit lines to the global bit line in response to the column selection signals, respectively.

6. The memory device of claim 5, wherein each of the switches is a P-type metal-oxide-semiconductor (PMOS) transistor.

7. A memory system comprising:
a memory device including:
a plurality of sub cell arrays, each comprising;
a plurality of memory cells respectively disposed at intersections of a plurality of local bit lines and a plurality of word lines;
a discharge line;
a plurality of diodes connected to the local bit lines, respectively, and to the discharge line; and
a switch connected between the discharge line and a ground and configured to selectively electrically couple the discharge line to the ground in response to a discharge enable signal; and
a processor, operatively coupled to the memory device, configured to control operations of the memory device.

8. The memory system of claim 7, wherein anodes of the respective diodes are connected to the local bit lines, respectively, and cathodes of the respective diodes are connected to the discharge line.

9. The memory system of claim 7, wherein each of the diodes comprises a cell diode or a planar diode.

10. The memory system of claim 7, further comprising a plurality of local bit line selection circuits each configured to connect one of the local bit lines to a global bit line in response to a plurality of column selection signals.

11. The memory system of claim 10, wherein each of the local bit line selection circuits comprises a plurality of switches configured to respectively connect the local bit lines to the global bit line in response to the column selection signals, respectively.

12. A non-volatile memory device comprising:
a word line operatively coupled to a non-volatile memory cell;
a local bit line operatively coupled to the non-volatile memory cell;
a discharge line associated with the local bit line and configured to discharge the local bit line;
a discharge diode electrically coupled between the local bit line and the discharge line; and
a switch, electrically connected between the discharge line and a reference level, the switch configured to selectively electrically couple the discharge line to the reference level in response to a discharge enable signal.

13. The non-volatile memory device of claim 12 wherein the discharge diode comprises an anode terminal coupled to the local bit line and a cathode terminal coupled to the discharge line.

14. The non-volatile memory device of claim 12 wherein the non-volatile memory device is included in a memory system, a mobile device, or a memory card.

* * * * *